United States Patent
Ahlgren et al.

(10) Patent No.: US 9,029,683 B2
(45) Date of Patent: May 12, 2015

(54) SELF-CONTAINED, MULTI-FLUID ENERGY CONVERSION AND MANAGEMENT SYSTEM FOR CONVERTING SOLAR ENERGY TO ELECTRIC AND THERMAL ENERGY

(75) Inventors: Ralph B. Ahlgren, San Jose, CA (US); Klaus Petry, San Jose, CA (US); A. Michael Flores, San Jose, CA (US)

(73) Assignee: Soleeva Solar, Inc., Ann Arbor, MI (US)

( * ) Notice: Subject to any disclaimer, the term of this patent is extended or adjusted under 35 U.S.C. 154(b) by 562 days.

(21) Appl. No.: 13/066,541

(22) Filed: Apr. 15, 2011

(65) Prior Publication Data

US 2012/0060898 A1 Mar. 15, 2012

Related U.S. Application Data

(63) Continuation-in-part of application No. 12/905,349, filed on Oct. 15, 2010.

(60) Provisional application No. 61/252,635, filed on Oct. 16, 2009.

(51) Int. Cl.
| | |
|---|---|
| *H01L 31/058* | (2006.01) |
| *F24J 2/24* | (2006.01) |
| *F24J 2/46* | (2006.01) |
| *H01L 31/042* | (2014.01) |
| *F24J 2/04* | (2006.01) |
| *H02S 40/44* | (2014.01) |
| *H01L 31/0525* | (2014.01) |
| *F24J 2/00* | (2014.01) |

(52) U.S. Cl.
CPC .............. *F24J 2/4647* (2013.01); *H01L 31/058* (2013.01); *H01L 31/0422* (2013.01); *F24J 2/0477* (2013.01); *F24J 2/242* (2013.01); *F24J 2002/0092* (2013.01); *F24J 2002/467* (2013.01); *Y02E 10/44* (2013.01); *Y02E 10/50* (2013.01); *Y02E 10/60* (2013.01); *H02S 20/00* (2013.01); *H02S 40/44* (2014.12)

(58) Field of Classification Search
CPC ......... F24J 2/0477; F24J 2/242; F24J 2/4647; F24J 2002/0092; F24J 2002/467; H01L 31/0422; H01L 31/058
USPC ........................................................ 136/248
See application file for complete search history.

(56) References Cited

U.S. PATENT DOCUMENTS

| | | | | |
|---|---|---|---|---|
| 3,939,818 | A * | 2/1976 | Hamilton et al. | 126/634 |
| 5,522,944 | A | 6/1996 | Elazari | |
| 5,643,369 | A * | 7/1997 | Tanaka et al. | 136/256 |
| 7,956,278 | B1 | 6/2011 | Popovich | |
| 2002/0189662 | A1 | 12/2002 | Lomparski | |
| 2003/0075213 | A1 | 4/2003 | Chen | |
| 2004/0025931 | A1 | 2/2004 | Aguglia | |
| 2004/0031518 | A1* | 2/2004 | Plantfeber | 136/251 |
| 2005/0133082 | A1* | 6/2005 | Konold et al. | 136/246 |

(Continued)

OTHER PUBLICATIONS

U.S. Appl. No. 61/252,635, filed Oct. 16, 2009, Ahlgren.

*Primary Examiner* — Matthew Martin
(74) *Attorney, Agent, or Firm* — Brian S. Boyer; Syndicated Law PC

(57) ABSTRACT

The teachings generally relate to a system for converting solar energy into electrical energy and thermal energy using a self-contained system having a plurality of channels for the heat transfer using a respective plurality of fluids.

20 Claims, 21 Drawing Sheets

(56) References Cited

U.S. PATENT DOCUMENTS

| | | |
|---|---|---|
| 2006/0118163 A1 | 6/2006 | Plaisted et al. |
| 2006/0207646 A1* | 9/2006 | Terreau et al. ............ 136/251 |
| 2007/0186922 A1* | 8/2007 | Guenter ................... 126/651 |
| 2008/0006323 A1 | 1/2008 | Kalkanoglu |
| 2008/0302405 A1 | 12/2008 | Intrieri |
| 2009/0314335 A1 | 12/2009 | McClintock |
| 2011/0088753 A1 | 4/2011 | Ahlgren |
| 2013/0160814 A1 | 6/2013 | Ahlgren |

\* cited by examiner

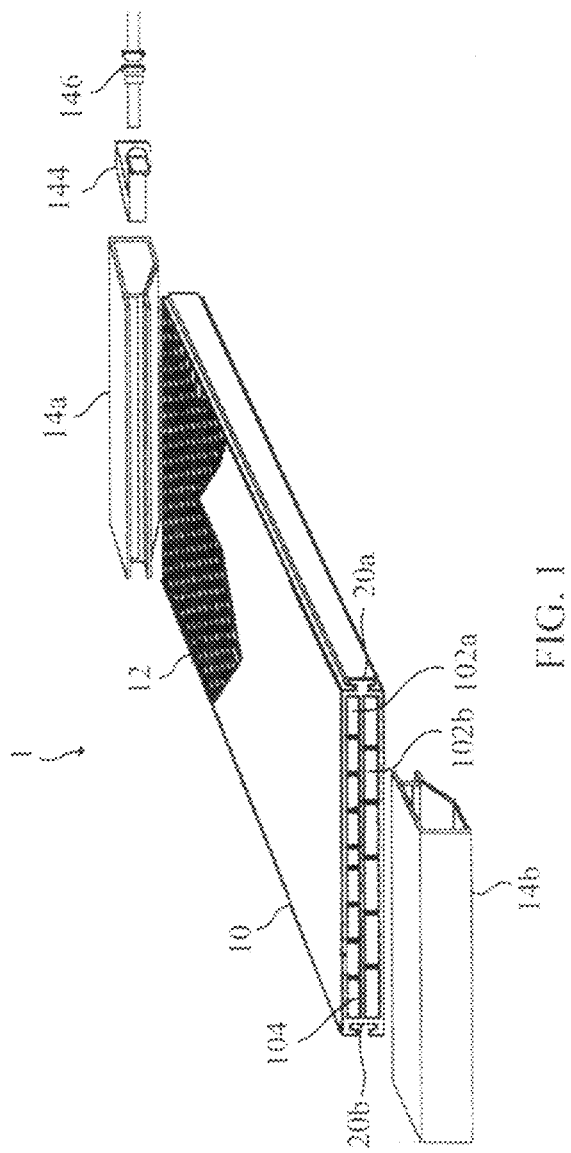

SELF-CONTAINED, MULTI-FLUID ENERGY CONVERSION AND MANAGEMENT SYSTEM FOR CONVERTING SOLAR ENERGY TO ELECTRIC AND THERMAL ENERGY

CROSS-REFERENCE TO RELATED APPLICATIONS

This application is a continuation-in-part of U.S. application Ser. No. 12/905,349, filed Oct. 15, 2010, and claims the benefit of U.S. Provisional Application No. 61/252,635, filed Oct. 16, 2009, each application of which is hereby incorporated herein by reference in its entirety.

BACKGROUND OF THE INVENTION

1. Field of the Invention

The teachings generally relate to a system for converting solar energy into electrical energy and thermal energy using a self-contained system having a plurality of channels for the heat transfer using a respective plurality of fluids, in which the system provides an energy density that includes electricity and thermal energy directed to at least two fluids.

2. Description of the Prior Art

In general, traditional solar panels may have photovoltaic arrays placed on a flat plate for converting solar energy to electric energy, a series of tubes are secured to the flat plate for collecting solar radiation onto to the flat plate and the photovoltaic arrays, and water to be heated is circulated through these tubes to extract the heat received by the photovoltaic arrays and the flat plate. Furthermore, the water circulated through these tubes may be used as a coolant for taking away the heat generated by the photovoltaic arrays.

For example, U.S. Pat. No. 5,522,944 describes a multi-purpose solar energy conversion system for converting solar energy to thermal and electrical energy, said system includes an array of photovoltaic cells for converting solar energy to electrical energy, and a plurality of interconnected heat collecting tubes disposed on the same plane as the array of photovoltaic cells for converting solar energy to thermal energy in a fluid disposed within the heat collecting tubes. However, the system employs the tubes/pipes which are complicated to fabricate and failed to provide a fast and efficient way to assemble the entire system.

Besides, the system also suffers from cold and icy conditions, where the temperature is such that circulating water in the panel may freeze and burst the pipes. Thus, the complicated tubes/pipes shall be a problem for maintaining such system. There is therefore an unresolved need in the art for a simple, reliable and inexpensive system without complicated tubes/pipes for converting solar energy to thermal and electric energy.

SUMMARY OF THE INVENTION

A purpose of the present invention is to provide a simple, reliable and inexpensive solar energy converter without complicated tubes/pipes for generating electric energy and heated fluid.

In accordance with the embodiment, the solar energy converter for generating electric energy and heated fluid comprises a multi-layer assembly, a photovoltaic panel and a manifold assembly. The multi-layer assembly is a casing and comprises N layers separated by at least one separator floor, each layer has at least one channel adapted to contain a fluid stream, and each layer has a first opening and a second opening. The photovoltaic panel has a top surface and a bottom surface, the bottom surface of the photovoltaic panel contacts the multi-layer assembly, the photovoltaic panel comprises a plurality of photovoltaic cells, disposed on the top surface, for gathering solar energy and converting the incident solar energy into electric energy, whereby the heating of the multi-layer assembly and the photovoltaic panel rises temperature of the fluid streams within each layer of the multi-layer assembly. The manifold assembly, detachably engaged with the multi-layer assembly, comprises N passages for containing the fluid streams, the Kth passage is adapted to distribute the fluid stream to be heated into the channel of the Kth layer through the corresponding first opening and collect the heated fluid stream from the channel of the Kth layer through the corresponding second opening, wherein N is a positive integer, K is a positive integer less than or equal to N.

In addition, the manifold assembly can be physically separated into a first manifold unit and a second manifold unit, the first manifold unit has N first passages, each of the first passages is adapted to align with the corresponding first opening of the multi-layer assembly, the second manifold unit has N second passages, each of the second passages is adapted to align with the corresponding second opening of the multi-layer assembly. Besides, each of the first passages of the first manifold unit comprises a first chamber and a first valve, the first chamber receives the fluid stream from a fluid source, and the first valve is adapted to align with the first opening of the channel of the corresponding layer for distributing the fluid stream to be heated into the channel of the corresponding layer. Moreover, the first chamber is a tubular space penetrating the first manifold unit and sealed by two end blocks at both ends, and at least one of the end blocks has an aperture thereon adapted to be detachably engaged with a connector for transporting the fluid stream from the fluid source to the first chamber.

A purpose of the present invention is to provide method for generating electric energy and heated fluid. Said method comprises the following steps: providing a photovoltaic panel comprising a plurality of photovoltaic cells for gathering solar energy and converting the incident solar energy into electric energy; providing a multi-layer assembly comprising N layers, each layer adapted to contain a fluid stream; distributing the fluid streams to be heated into the N layers; rising temperature of the fluid streams within each layer of the multi-layer assembly by the heating of the multi-layer assembly and the photovoltaic panel; collecting the heated fluid stream from the N layers, wherein N is a positive integer.

A purpose of the present invention is to provide a simple, reliable and inexpensive solar energy conversion system without complicated tubes/pipes for generating electric energy and heated fluid.

In accordance with the embodiment, the solar energy conversion system comprises a mounting frame, a plurality of solar energy converters, an umbilical connecting device. The plurality of solar energy converters are detachably fixed on the mounting frame respectively.

Each of the solar energy converter comprises a multi-layer assembly, a photovoltaic panel and a manifold assembly. The multi-layer assembly is a casing and comprises N layers separated by at least one separator floor, each layer has at least one channel adapted to contain a fluid stream, and each layer has a first opening and a second opening. The photovoltaic panel has a top surface and a bottom surface, the bottom surface of the photovoltaic panel contacts the multi-layer assembly, the photovoltaic panel comprises a plurality of photovoltaic cells, disposed on the top surface, for gathering solar energy and converting the incident solar energy into electric energy, whereby the heating of the multi-layer assembly and the photovoltaic panel rises temperature of the fluid streams within each layer of the multi-layer assembly. The manifold assembly, detachably engaged with the multi-layer assembly, comprises N passages for containing the fluid streams, the Kth passage is adapted to distribute the fluid stream to be heated into the channel of the Kth layer through the corresponding first opening and collect the heated fluid stream from the channel of the Kth layer through the corresponding second opening, wherein N is a positive integer, K is a positive integer less than or equal to N.

Besides, the umbilical connecting device physically combines the passages of at least two the manifold assemblies of the plurality of solar energy converters for sharing the fluid streams contained therein.

Accordingly, the solar energy converter of the present invention eliminates the need to utilize assembled piping, such as copper piping, internally under the photovoltaic panel. The multi-layer assembly and the manifold assembly can be manufactured in one step respectively, and the solar energy conversion system provides a user to easily assemble multiple units of the system by mounting them on the frame to accommodate the user's needs.

BRIEF DESCRIPTION OF THE APPENDED DRAWINGS

FIG. 1 illustrates a 3D diagram of a solar energy converter, according to some embodiments.

DETAILED DESCRIPTION OF THE INVENTION

Figure 2A:
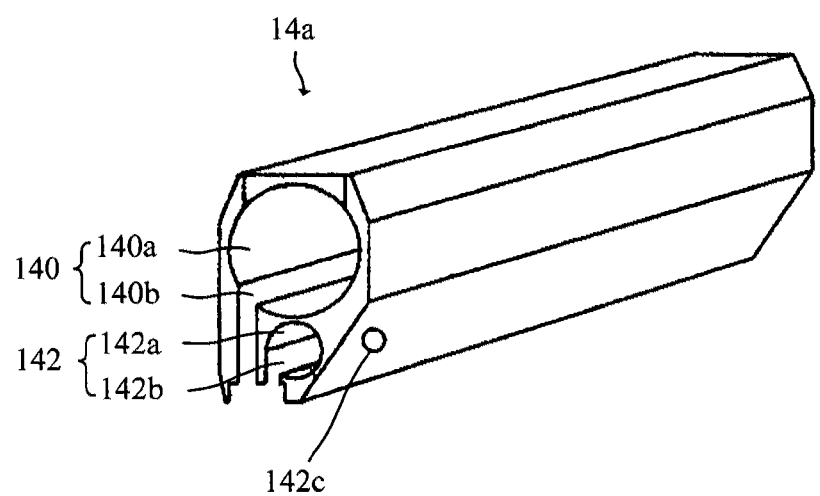
FIG. 2a illustrates a 3D diagram of the first manifold unit, according to some embodiments.

The teachings generally relate to a system for converting solar energy into electrical energy and thermal energy using a self-contained system having a plurality of channels for the heat transfer using a respective plurality of fluids, in which the system provides an energy density that includes electricity and thermal energy directed to at least two fluids. The concepts presented herein are generally directed to capturing all, useable solar energy in a single-unit apparatus, whether electric energy produced through solar energy conversion, or thermal energy extracted from the solar energy and conversion process. The systems provided herein provided efficiencies and conversions that were unexpected and surprising over the state of the art, as they provide electric, thermal for liquid heating and thermal energy for gas heating. A unique aspect is that the system is a single-unit system that contains highly packed thermal transfer channels that contain at least two working fluids, and these two fluids can be a liquid and a gas, a liquid and a liquid, or a gas and a gas. Each of the fluids can be the same or different in some embodiments, depending on the desired application. Three modalities are provided in a single, efficient unit.

In some embodiments, the teachings are directed to a self-contained and highly efficient, multi-fluid energy conversion and management system for converting solar energy to electric and thermal energy. In these embodiments, the system can comprise a core component that includes (i) a photovoltaic layer for converting solar energy to electrical energy, (ii) a gas thermal exchange layer for heat transfer into gas media, and (iii) a liquid thermal exchange layer for heat transfer into liquid media. Each of the thermal exchange layers can be configured to be in operable thermal contact with at least one other layers. Likewise, each of the thermal exchange layers can contain a channel for transport of a gas or liquid and provide a thermal contact between a wall of the channel and a wall of at least one of the other layers.

It should be appreciated that the highly efficient thermal contact provided by the teachings herein are a vast improvement over the state-of-the-art. In some embodiments, the thermal contact, on the channel that is in direct contact with an adjacent layer, ranges from about 12% to less than about 45% of the abluminal area of the wall of the channel. In some embodiments, such thermal contact can range from about 10% to about 49%, from about 14% to about 40%, from about 15% to about 38%, from about 17% to about 35%, from about 20% to about 33%, from about 22% to about 30% from about 25% to about 47%, from about 16% to about 45%, or any range therein. In fact, any percent thermal contact between the side of the channel and the adjacent layer, ranging from about 5% to about 49%, in any single percentage or range of percentages in 1% increments between about 5% and about 49%, can be used in some embodiments.

A manifold component operable for distributing thermal energy from the core component is used in many embodiments to distribute energy from the thermal exchange layers. The distribution can be done to keep the photovoltaic cells cool to increase their output and substantially extend their life, or the distribution can provide the energy for another use, such as heating water or air. The manifold can be attached to the system using any means known to one of skill. In some embodiments, the manifold can be attached using soldering, brazing, or welding. In some embodiments, the manifold can be attached using epoxy or other adhesives, as well as by fasteners and/or sealants and gaskets. In some embodiments, the manifold can be cast or extruded alone or with the core component that contains the multi-fluid, multi-channel heat exchanger assembly.

It should be appreciated that the improved systems taught herein provide an improved cooling of the photovoltaic cells. One of skill understands that cooling of photovoltaic cells has the advantage of improving power output and extending the life of the cells. Those of skill have been limited to non-uniform cooling, at best, in the state of the art, and this has resulted in the creation of "hot spots" on or in the photovoltaic cells that deleteriously affects life and performance of the cells.

The single unit thermal exchange systems taught herein, whether produced through extrusion or casting, for example, provide an enhanced cooling and, thus, performance, over current state of the art systems. The teachings herein provide systems in which the photovoltaic cells are cooled relatively uniformly, such that they do not have significant hot spots and thermal degradation occurring in the photovoltaic cells as a result. As such, the systems taught herein can operate over a wider temperature range. State of the art systems start to break down at 140-160 F. The systems taught herein can extract heat without generating hot spots in the photovoltaic cells, allowing the surface heat on the panel to increase by about 10-15 degrees under operation, thus allowing a broader range of use in terms of environmental conditions. One of skill will appreciate that ballistic reliability models suggest that for every 10 degree rise in temperature, rates of chemical reaction double. This suggests that dropping from 140 to 80 for example is a 60 degree decrease in degradation reaction temperature, or a 6× increase in life of a photovoltaic cell. By reducing the "hot spots" that occur across the photovoltaic cells in state of the art systems that are limited to simple tubing carrying fluids, we can also increase life of photovoltaic cell. Hot spots can cause a localized failure in a photovoltaic cell and shut down the entire panel.

The results of the cooling effects on the photovoltaic cells provided several surprising and unexpected results. An improvement in power output can be seen, in some embodiments, to range for example, up to about 60% over state of the art photovoltaic systems that use traditional tube cooling systems. As described herein, the life of the photovoltaic cell can also be expected to increase dramatically as a result of the cooling, particularly as a result of the uniform cooling that is offered by the systems taught herein.

It should also be appreciated that the design of the system includes a tightly packed plurality of channels. This design creates a much more efficient set of heat transfer conditions than is otherwise available in the state of the art. In some embodiments, at least one of the layers can have a channel packing efficiency for the plurality of channels in the layer ranging from about 78% to about 99%. The term "packing efficiency" can refer to the ratio of cross-sectional area of the luminal portion of the channels to the cross sectional area of the luminal portion of the layer. In some embodiments, the packing efficiency can range from about 30% to about 80%, from about 40% to about 75%, from about 50% to about 70%. In some embodiments, the packing efficiency can be about 25%, about 30%, about 35%, about 40%, about 45%, about 50%, about 55%, about 60%, about 65%, about 70%, about 75%, about 80%, about 85%, about 90%, about 95%, about 97% or about 99%.

In some embodiments, the manifold component can be detachably engaged with the core component and functions to separate the thermal energy into a plurality of streams comprising a gas stream and a liquid stream. It should be appreciated that an optional additional heat transfer system can be added to include an additional working fluid. In some embodiments, this additional working fluid can be used as a heat radiator, for example, which can be an excellent use of a waste heat stream from another source.

The layers and channels can be oriented in a virtually infinite number of configurations, as long as the desired configuration effectively channels a combination of fluids, such as a gas and a liquid, to effectively provide thermal contacts that channel heat energy through the system. In some embodiments, the layers or channels can be configured in a stacked orientation, where the direction of the channels are parallel, intersecting, or some combination thereof. In some embodiments, the layers or channels can be configured in an alternate orientation to extend the contact time between the fluid and the luminal service of the channel, such as a spiral configuration. In some embodiments, the core component comprises channels configured in a honey-comb pattern.

The layers and channels can be produced from virtually any material that one of skill would believe to be useful with the present teachings. In some embodiments, the materials can include a conductive material, such as a metal or alloy. In some embodiments, the materials can include a transparent or translucent material, such as a glass or plastic. In some embodiments, the materials can include a ceramic.

In the selection of design, one of skill can appreciate that the materials chosen can affect the design chosen. In some embodiments, for example, a transparent or translucent material may be selected to increase the ability of solar energy to penetrate the system. In these embodiments, the "pitch" or distance between the wafers can be increased or decreased as desired to allow more or less solar energy to penetrate the system between the wafers. Likewise, the pitch, or distance between, the channels can be introduced into the design and varied according to the selection of working fluids or location of the system geographically, in response to environmental changes and/or user needs.

The channels can be manufactured as a single unit, as described herein, where each layer is its own unit, or a stack or other compilation of layers and channels can be formed as a single unit. In some embodiments, each layer in the core component can be in thermal contact with a separator floor that separates that layer from at least one other layer in the system. The separator floor can be opaque, in some embodiments, or transparent. In some embodiments, the separator floor can be translucent. In some embodiments, the separator floors between the layers for a plurality of separator floors that have at least one opaque separator floor and at least one transparent or translucent separator floor.

In some embodiments, at least one of the thermal exchange layers in the core component can be formed by a single mass of material. In these embodiments, an extrusion or casting process can be used. In some embodiments, the core component can include a component formed by extrusion and a component formed by casting.

In some embodiments, at least a portion of the core component can be transparent. In some embodiments, at least a portion of the core component is coated with a surface coating for enhancing protection from corrosion. And, in some embodiments, at least a portion of the core component can be coated with a surface coating for enhancing absorption of the infra-red spectrum of the solar energy.

The system can have a manifold component that distributes energy. The manifold component can comprise a plurality of channels, each channel in the plurality of channels corresponding to a thermal exchange layer in the core component. In some embodiments, the system can induce turbulent flow in which, for example, the core component or the manifold component can be configured to create the turbulent flow in a liquid stream for increasing heat transfer efficiency. In some embodiments, a luminal surface of a channel has a contour that creates turbulent flow. In some embodiments, the contour can be analogous to rifling. One of skill will readily know how to create turbulent flow in a channel.

In some embodiments, the core component and/or manifold component can further comprise a cleaning passage for cleaning the photovoltaic panel. The cleaning passage can comprises a cleaning chamber and a cleaning valve, where the cleaning valve is substantially aligned with the top surface of the photovoltaic panel, and the cleaning chamber contains water distributing from the cleaning valve to clean the photovoltaic panel.

In some embodiments, the teachings are directed to a method for generating electric energy and heated fluid. The method can include providing a first photovoltaic panel comprising a plurality of photovoltaic cells for converting the incident solar energy into electric energy. A multi-layer assembly comprising a plurality of thermal exchange layers can also be provided, in which at least one of the plurality of layers containing a channel for transporting heat to a gas and at least one of the plurality of layers containing a channel for transporting heat to a liquid. The method can include distributing the gas and the liquid from the multi-layer assembly to transport thermal energy for a use, where the use can be to cool the system or for another use of the thermal energy, such as to heat air or water in some embodiments.

In some embodiments, the method can include further providing a second photovoltaic panel. The second photovoltaic panel can be positioned in any orientation desired by one of skill to perform the function of capturing scatter radiation and converting it to electric energy. In some embodiments the second photovoltaic panel can be placed opposing the first photovoltaic panel and comprising a plurality of photovoltaic cells for converting scatter solar energy into electrical energy.

In some embodiments, the teachings are directed to a solar energy conversion system having a casing containing (i) a first photovoltaic layer for converting incident solar energy to electrical energy, (ii) a gas thermal exchange layer for heat transfer into gas media, (iii) a liquid thermal exchange layer for heat transfer into liquid media; and a second photovoltaic layer for converting scatter solar energy to electrical energy. In these embodiments, the system can substantially increase the power output per unit area of the system over a system that does not convert scatter solar energy into electrical energy.

The teachings provided herein can provide a "substantial increase" in energy production, energy density, or thermal efficiency. This term can refer to an increase of 10%, 15%, 20%, 25%, 30%, 35%, 40%, 45%, 50%, 55%, 60%, 65%, 70%, 75%, 80%, 85%, 90%, 95%, 97%, 99% or 100%.

In some embodiments, the increase in energy production, whether electrical or thermal can range from about 45% to about 100%, from about 50% to about 95%, from about 60% to about 75%, from about 65% to about 85%, from about 30% to about 50%, from about 25% to about 70%, or any range therein. The amount of power produced per unit area can be referred to as "energy density", and in some embodiments, the teachings provided herein can cause energy density to substantially increase, sometimes even double.

FIG. 1 illustrates a 3D diagram of a solar energy converter, according to some embodiments. As shown in FIG. 1, the solar energy converter 1 has a multi-layer assembly 10, a photovoltaic panel 12, a manifold assembly comprising a first manifold unit 14a and a second manifold unit 14b.

The multi-layer assembly 10 is a casing and comprises N layers separated by a plurality of separator floors, N is a positive integer. For example, the multi-layer assembly 10 has two layers, first layer 102a and second layer 102b, in this embodiment, and the two layers are separated by a separator floor 104. In practice, each of the N layers of the multi-layer assembly 10 shall be parallel to one another, and each layer has several channels adapted to contain a fluid stream. For example, the first layer 102a may be adapted to contain water stream and the second layer 102b may be adapted to contain air stream. The channels of all the layers form a pattern of honey-comb in a cross-sectional view along an extension direction of the channels. The channels can also be separated by the separator floor 104, that is, the separator floor 104 can be manufactured in certain pattern for creating the N-layer structure and the channels within each layer.

In addition, the multi-layer assembly 10 is made of aluminum and manufactured by an aluminum extrusion process. The material of the multi-layer assembly 10 is generally constructed of extruded high strength aluminum alloy to assure long life, more specifically, the material of the multi-layer assembly 10 shall preferably be 6061 or 6063 aluminum. It should be mentioned that the multi-layer assembly 10 can be, but not limited to, made of any suitable ductile metal or material. Those skilled in the art can replace aluminum with other appropriate materials. By using an extruded aluminum multi-layer assembly 10, costly individual tube assemblies and frames can be avoided. Moreover, the jointless design of the multi-layer assembly 10 can reduce fluid leakages of those layers and potential failure points.

Furthermore, the multi-layer assembly 10 can be coated with a surface coating for enhancing protection from corrosive atmospheres and absorption of the infra-red spectrum of the incident solar energy. In practice, the multi-layer assembly 10 can be coated with a hard black anodizing to attract maximum heat from the sun's rays and improve absorption of solar radiation. Those skilled in the art can understand that the surface coating can further be powder coating, anodizing or other methods or materials. These coatings may contain carbon nano materials to enhance coating lifetimes, enhance energy absorption and provide enhanced thermal transfer between the photovoltaic panel 12 and the multi-layer assembly 10. Besides, the surface coating can cover entire or partial exterior of the multi-layer assembly 10, and the multi-layer assembly 10 can be arranged with its blackened surface facing the sun and sloped at a suitable angle to optimize the solar energy collected. The backside of the multi-layer assembly 10 can be insulated by a layer of insulating material such as glass wool or plastic foam.

The photovoltaic panel 12 has a top surface and a bottom surface, the bottom surface of the photovoltaic panel 12 contacts the multi-layer assembly 10, the photovoltaic panel 12 comprises a plurality of photovoltaic cells, disposed on the top surface, for gathering solar energy and converting the incident solar energy into electric energy, whereby the heating of the multi-layer assembly 10 and the photovoltaic panel 12 rises temperature of the fluid streams within each layer of the multi-layer assembly 10. In practice, the photovoltaic panel 12 does not necessarily cover the entire top surface of the multi-layer assembly 10, and the plurality of photovoltaic cells can be bonded to the top surface randomly or in array. The photovoltaic panel 12 can be further covered by tempered glass (not shown in figures) coated with anti-reflective coatings to enhance light transmission.

The manifold assembly can be detachably engaged with the multi-layer assembly 10. In practice, the manifold assembly comprises two physically separated manifold units, the first manifold unit 14a and the second manifold unit 14b, for containing the fluid streams. The inner structures of the first manifold unit 14a and the second manifold unit 14b are substantially the same. The first manifold unit 14a and the second manifold unit 14b can also be manufactured by the extrusion process mentioned above.

FIG. 2a illustrates a 3D diagram of the first manifold unit 14a, according to some embodiments. As shown in FIGS. 1 and 2a, the first manifold unit 14a has two first passages, passage 140 and 142. In practice, the first passage 140 has two parts, a first chamber 140a and a first valve 140b respectively, the first chamber 140a receives the fluid stream from a fluid source (not shown in figures), and the first valve 140b is adapted to align with the first opening of the corresponding layer for distributing the fluid stream to be heated into the channel of the corresponding layer. For example, the first passage 140 contains water stream, the first chamber 140a receives the water stream from a water tank or a water supply, and the first valve 140b distributes the water stream into the first layer 102a. Similarly, the first passage 142 contains air stream in the first chamber 142a, and the first valve 142b distributes the air stream into the second layer 102b.

Specifically, the first chambers 140a and 142a are tubular spaces penetrating the first manifold unit 14a. For example, the first chambers 140a can be sealed by two end blocks 144 at both ends, and at least one of the end blocks 144 has an aperture thereon adapted to be detachably engaged with a connector 146 for transporting the water stream from the water supply to the first chamber 140a. It should be noticed that the fluid stream can be infused into the first chamber without using the end block 144.

Figure 2B:
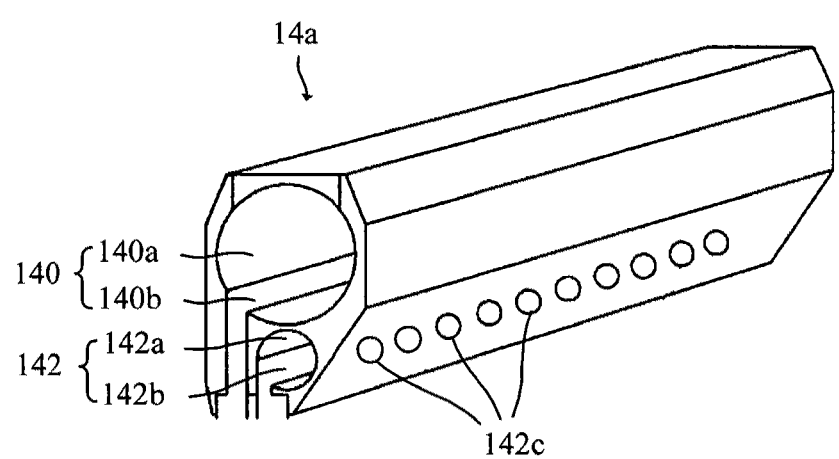
FIG. 2b illustrates a 3D diagram of the first manifold unit, according to some embodiments.

Referring to FIG. 2a and FIG. 2b, FIG. 2b illustrates a 3D diagram of the first manifold unit 14a, according to some embodiments. As shown in FIG. 2a and FIG. 2b, the first manifold unit 14a can further comprises one or several air intakes 142c connected the first chamber 142a for receiving air stream from outside. In this case, the air intake 142c can be integrated with a filter screen to keep the impurities in air from getting inside the first chamber 142a.

The manifold assembly also incorporates a specialized spray device enable an external self-cleaning feature in the design to remove foreign debris from the top surface of the photovoltaic panel 12 and the multi-layer assembly 10 which might cause shadowing on the photovoltaic cells and lead to under performance of the entire array.

Figure 2C:
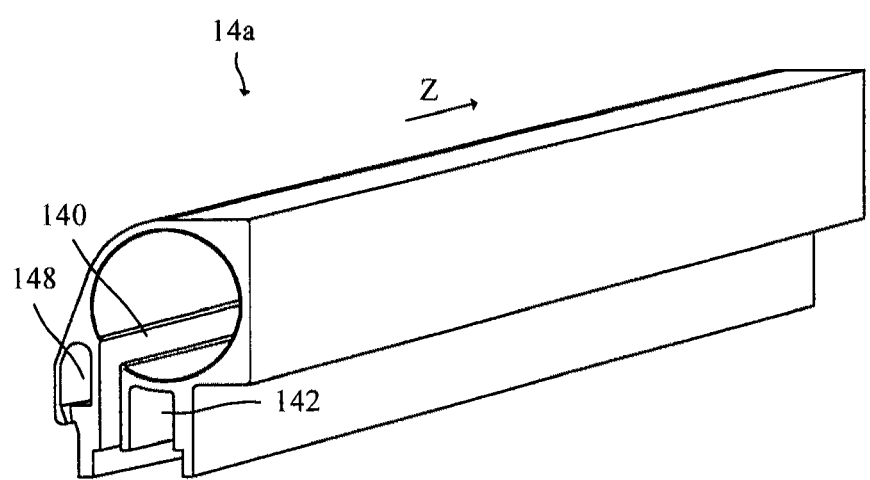
FIG. 2c illustrates a 3D diagram of the first manifold unit, according to some embodiments.
Figure 2D:
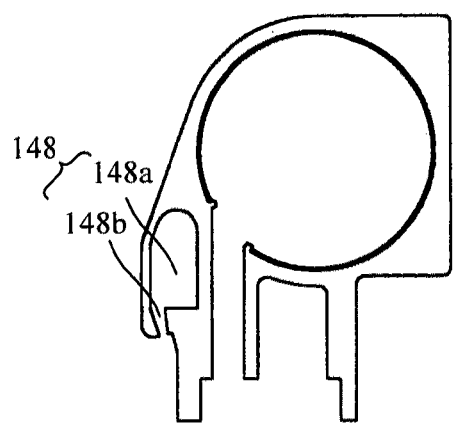
FIG. 2d illustrates a sectional drawing along direction Z in FIG. 2c.

Referring to FIG. 2c and FIG. 2d, FIG. 2c illustrates a 3D diagram of the first manifold unit 14a, according to some embodiments. FIG. 2d illustrates a sectional drawing along direction Z in FIG. 2c. As shown in FIG. 2c and FIG. 2d, the first manifold unit 14a comprises a cleaning passage 148 for cleaning the photovoltaic panel 12, the cleaning passage comprises a cleaning chamber 148a and a cleaning valve 148b, the cleaning valve 148b is substantially align with the top surface of the photovoltaic panel 12, the cleaning chamber 148a contain water for gushing out of the cleaning valve 148b to clean the photovoltaic panel 12.

In general, an O-ring or similar device can be further disposed between the first manifold unit 14 and the multi-layer assembly 10 for sealing the fluid stream within the first passage and the channel of the corresponding layer.

Figure 3A:
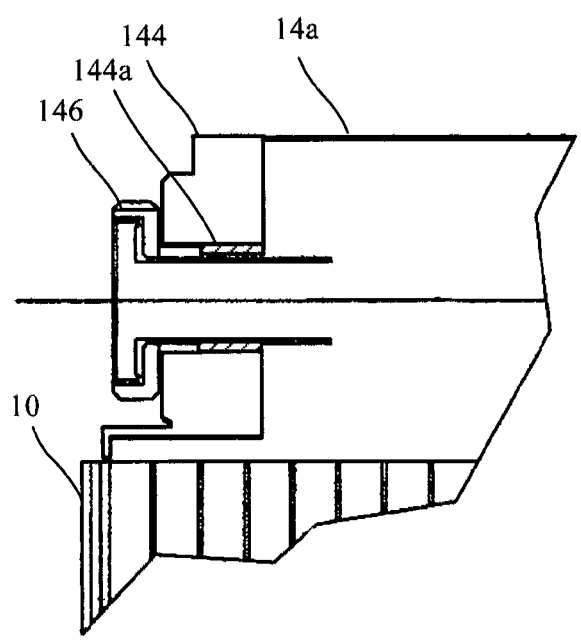
FIG. 3a illustrates a lateral view of the end block and a part of the connector, according to some embodiments.

Regarding the details of the end block 144 and the connector 146, please refer to FIG. 3a, where FIG. 3a illustrates a lateral view of the end block 144 and a part of the connector 146, according to some embodiments. As shown in FIG. 3, the end block 144 located at one end of the first manifold unit 14a for sealing the first chambers 140a, the end block 144 has an aperture thereon adapted to be detachably engaged with a connector 146. Specifically, the end block 144 can also comprises an O-ring 144a to avoid fluid leakage while connecting the connector 146.

Figure 3B:
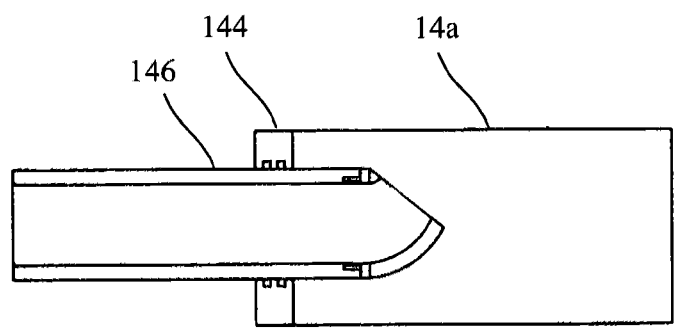
FIG. 3b illustrates a schematic diagram of the end block and a part of the connector, according to some embodiments.

In addition, the connector 146 can comprises a vaned or finned intake tube inserted into the aperture of the end block 144 to create a turbulent flow in the fluid stream for increasing a heat transfer efficiency. Please refer to FIG. 3b, FIG. 3b illustrates a schematic diagram of the end block 144 and a part of the connector 146, according to some embodiments. The connector 146 comprises a bent intake tube converts a portion of the mechanical energy of the circulating fluid stream to generate a turbulent flow environment in the fluid stream to enhance heat transfer between the photovoltaic cells and the fluid stream, preventing sedimentation and making the unit self cleaning.

Figure 4:
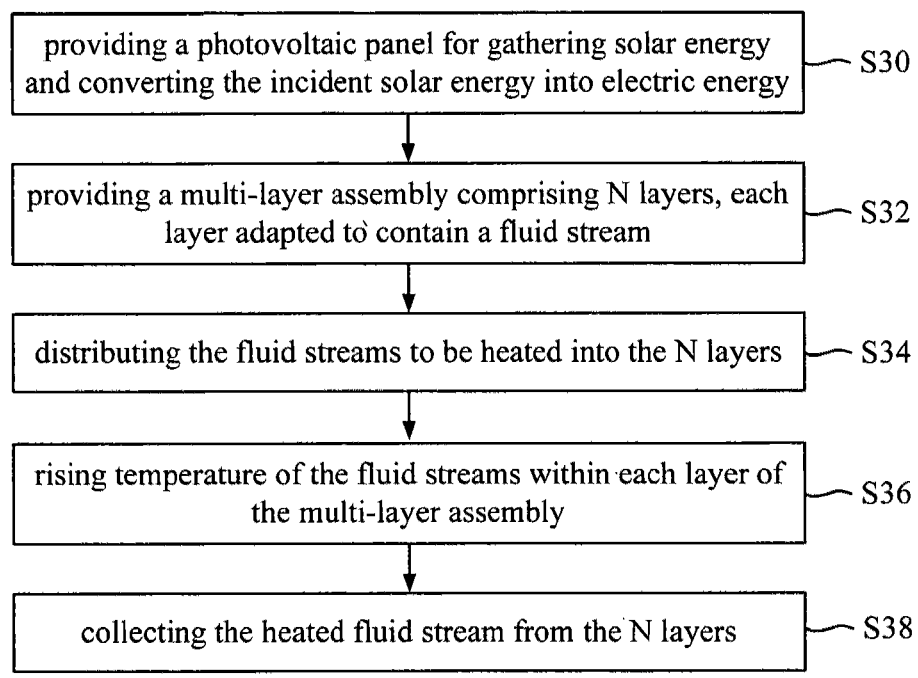
FIG. 4 illustrates a flow chart, according to some embodiments.

The solar energy converter 1 can be further realized via the method of the present invention. Referring to FIG. 1 and FIG. 4, FIG. 4 illustrates a flow chart, according to some embodiments. As shown in figures, in step S30, the photovoltaic panel 12 is provided for gathering solar energy and converting the incident solar energy into electric energy. In general, the solar energy converter 1 can separate the solar energy into three separate energy streams. The photovoltaic panel 12 comprises a plurality of photovoltaic cells placed on the sun facing surface of the photovoltaic panel 12 for converting the incident solar energy into electric energy. In step S32, a multi-layer assembly 10 is provided for contain fluid streams. In practice, the multi-layer assembly 10 comprising N layers, each layer adapted to contain a fluid stream.

In step S34, the first manifold unit 14a distributes the fluid streams to be heated into the N layers of the multi-layer assembly 10. In step S36, the heating of the multi-layer assembly 10 and the photovoltaic panel 12 rises temperature of the fluid streams within each layer of the multi-layer assembly 10, that is, the fluid streams within each layer of the multi-layer assembly 10 taking away the heat generated by the photovoltaic panel 12 during the conversion of thermal-electric energy and the heat incident into the multi-layer assembly 10 directly. Moreover, the efficiency of the photovoltaic panel 12 can be increased by cooling and maintaining a constant temperature throughout the daily solar cycle and thus mitigating the heat induced efficiency losses characteristic of photovoltaic cells.

In step S38, the second manifold unit 14b collects the heated fluid stream from the N layers. In practice, the second manifold unit 14b can be connected to a heating, a radiator, a geyser, a water tank, or other appropriate device. The first manifold unit 14a can be connected to a fluid source for receiving the fluid stream. The second manifold unit 14b can also be connected to a suction pump to extract the air out of the corresponding layer. Hot air produced with the present invention can be used in agriculture for drying of fruits and vegetables.

Figure 5:
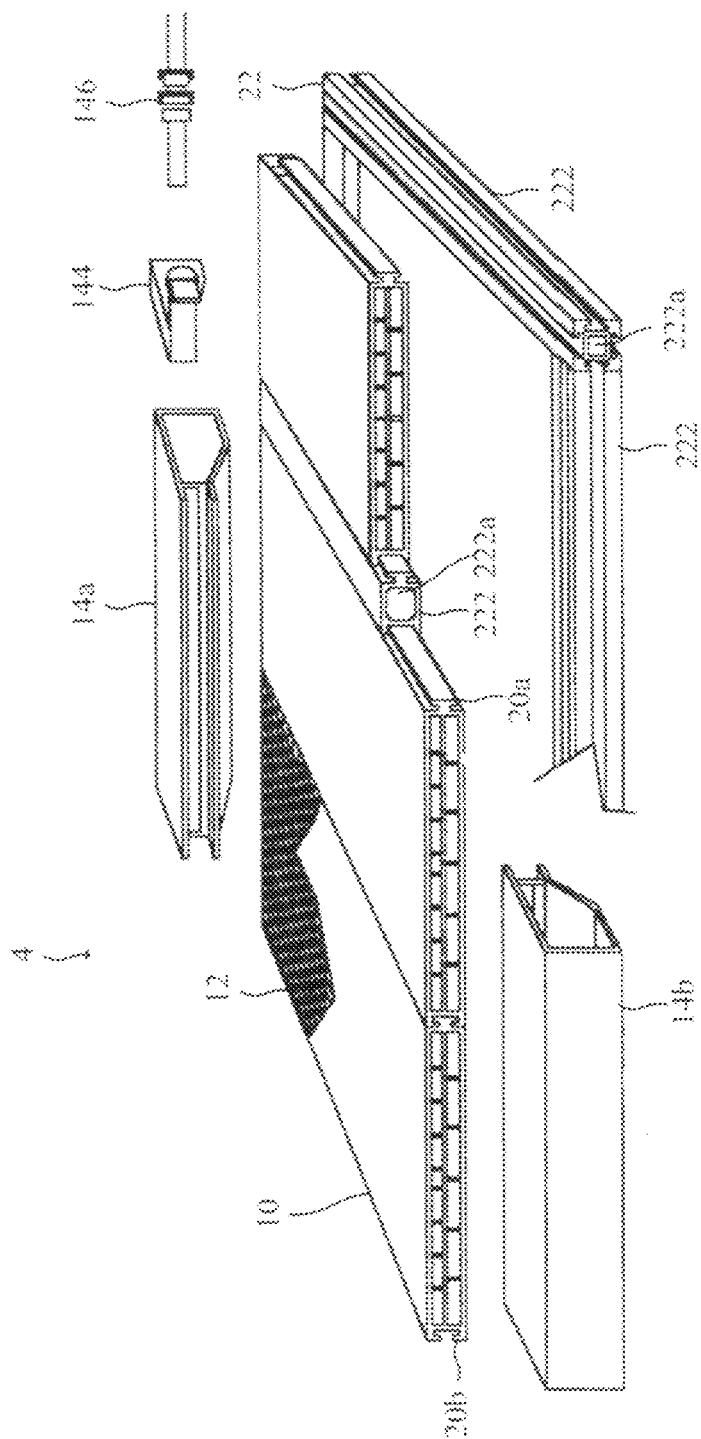
FIG. 5 illustrates a 3D diagram of a solar energy conversion system, according to some embodiments.

The teachings provided herein also disclose a solar energy conversion system; please refer to FIG. 1 and FIG. 5. FIG. 5 illustrates a 3D diagram of a solar energy conversion system, according to some embodiments. As shown in figures, the solar energy conversion system 4 comprises a plurality of solar energy converter 1, the details of the solar energy converter 1 are not repeated here. It should be noticed that the plurality of solar energy converters 1 can connect to each other by "T" rails 20a and corresponding "T" slots 20b. Those skilled in the art can replace the "T" rails 20a and "T" slots 20b with other similar apparatus, for example a convex portion and a corresponding concave portion suitable to fix the convex portion. Therefore, the size of the solar energy conversion system 4 can be easily enlarged by connecting the plurality of solar energy converters 1.

The solar energy conversion system 4 comprises a mounting frame 22 having a plurality of risers 222 detachably engaged with one another. The solar energy converter 1 can be detachably mounted on the adjacent riser 222 by the same apparatus of the "T" rails and the corresponding "T" slots. Therefore, the connection of the solar energy conversion system 4 is very simple and easy by using the risers with the "T" rails and the corresponding "T" slots, and every solar energy converters 1 within the solar energy conversion system 4 can be located, aligned, and tight down with the mounting frame 22 at the same time.

In addition, the mounting frame 22 further comprises a groove and the solar energy converter 1 comprises a pin, the pin can be affixed to the sides of the solar energy converter 1 to locate into corresponding groove in the sides of the mounting frame 22 and also which allows for the solar energy converter 1 to be quickly mounted into the mounting frame 22.

Besides, the riser 222 may incorporate a tunnel 222a through the entire length of the riser 222. The tunnel 222a creates a vortex aides with a downward pressure reaction of the trapped wind inside the tunnel 222a. Therefore, the solar energy conversion system 4 can be disposed firmly on a roof or other windy place.

Figure 6:
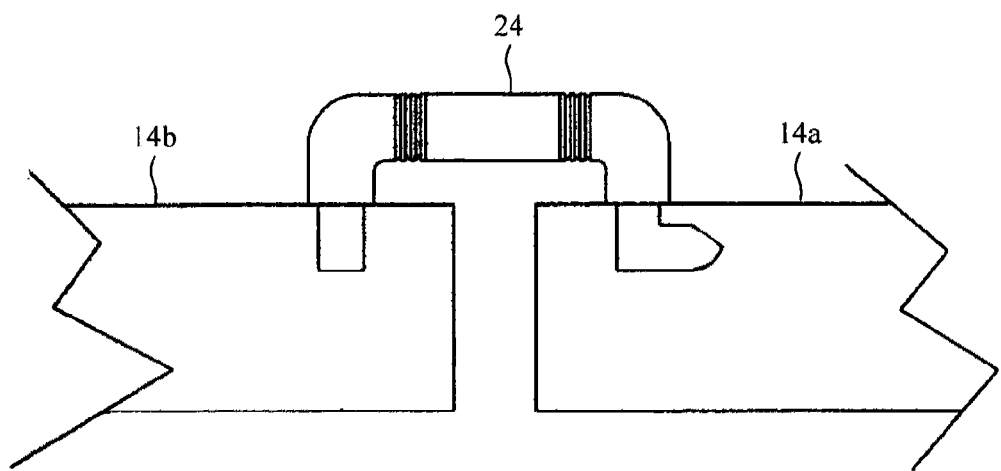
FIG. 6 illustrates a schematic diagram of an umbilical connecting device; according to some embodiments.

Referring to FIG. 5 and FIG. 6, FIG. 6 illustrates a schematic diagram of an umbilical connecting device, according to some embodiments. As shown in figures, the solar energy conversion system 4 further comprises an umbilical connecting device 24 physically combining the passages of at least two the manifold assemblies of the plurality of solar energy converters 1 for sharing the fluid streams contained therein. In practice, the umbilical connecting device 24 connects the second manifold unit 14b of one solar energy converter 1 to the first manifold unit 14a of another solar energy converter 1. Thus, the fluid streams from the fluid sources or similar devices can be shared within all solar energy converters 1. It should be noticed that the plurality of solar energy converter 1 can be connected not only in series connections but also in parallel connections, that is, those skilled in the art can realize that the umbilical connecting device 24 can connect the second manifold unit 14b of one solar energy converter 1 to the plurality of first manifold units 14a of corresponding solar energy converters 1.

Figure 7A:
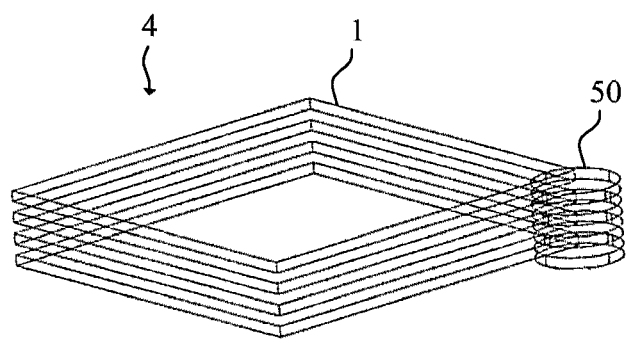
FIG. 7a illustrates a schematic diagram of a folded solar energy conversion system, according to some embodiments.
Figure 7B:
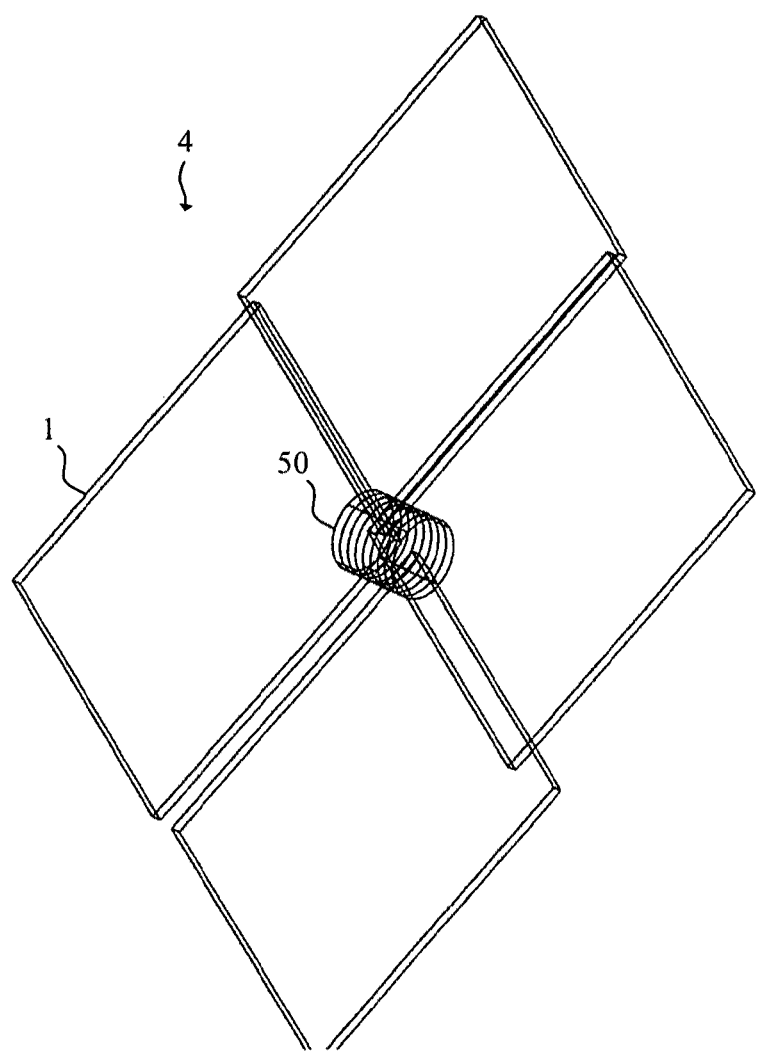
FIG. 7b illustrates a schematic diagram of the unfolded solar energy conversion system, according to some embodiments.
Figure 7C:
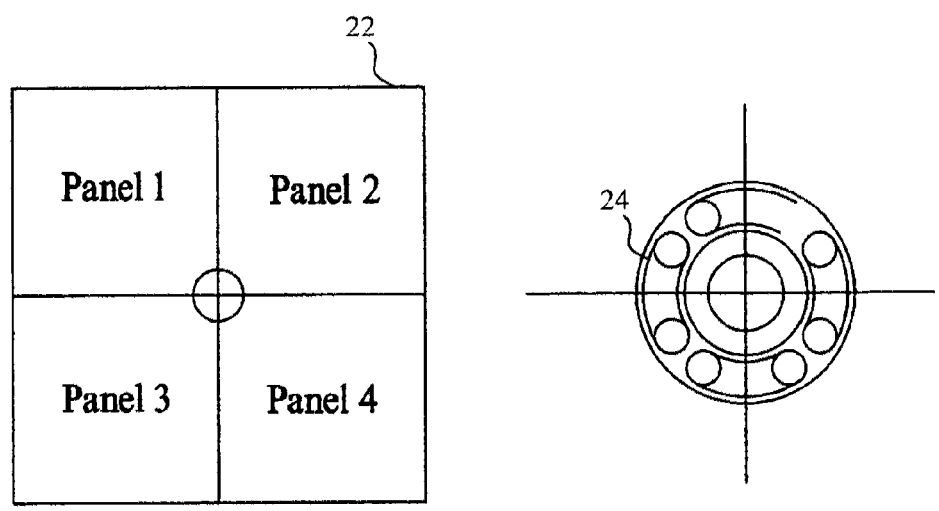
FIG. 7c illustrates a vertical view of FIG. 7b.

Those skilled in the art can further realize that the solar energy conversion system 4 is not necessarily a plane system. For example, the solar energy conversion system 4 can be folded to a small package as shown in FIG. 7a, FIG. 7b, and FIG. 7c. FIG. 7a illustrates a schematic diagram of a folded solar energy conversion system 4, according to some embodiments. FIG. 7a illustrates a schematic diagram of a folded solar energy conversion system 4, according to some embodiments. FIG. 7b illustrates a schematic diagram of the unfolded solar energy conversion system 4, according to some embodiments. FIG. 7c illustrates a vertical view of FIG. 7b. As shown in figures, the solar energy conversion system 4 comprises, for example, four solar energy converters 1, the manifold assembly of the solar energy converters 1, the mounting frame and the umbilical connecting device can be integrated inside a column 50. Specifically, small rotatable manifold assemblies are connected to each solar energy converters 1 and stacked inside the column 50. The umbilical connecting device applied in this embodiment shall be flexible and shielded tubes and cables. The amount of the solar energy converter 1 can vary and is not restricted to a particular number.

Figure 8:
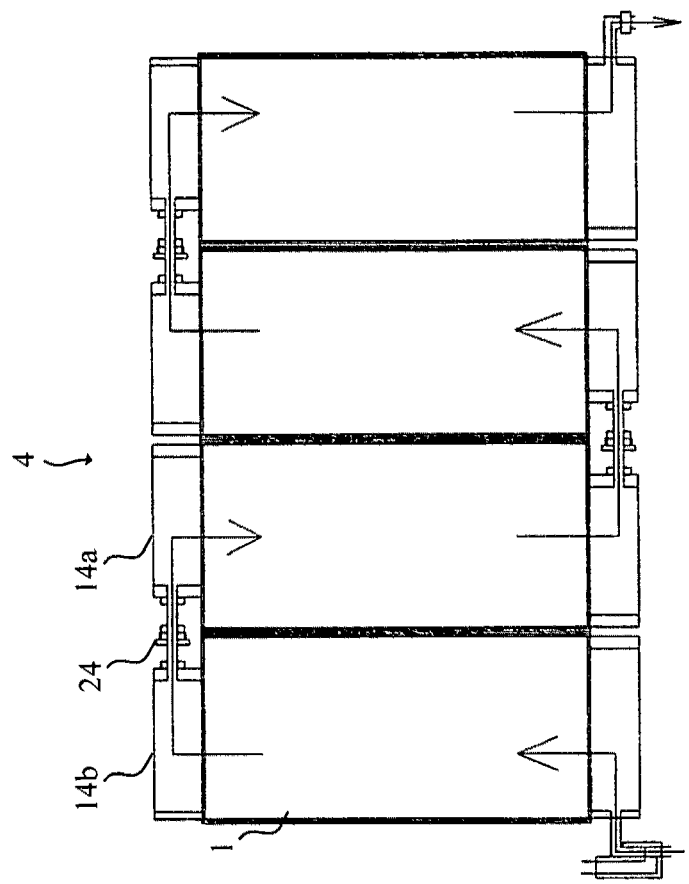
FIG. 8 illustrates a schematic diagram of another folded solar energy conversion system, according to some embodiments.

FIG. 8 illustrates a schematic diagram of another folded solar energy conversion system 4, according to some embodiments. The solar energy conversion system 4 in this embodiment comprises several solar energy converters 1, and the adjacent solar energy converters 1 can double up and connect to each other by the flexible umbilical connecting device 24.

Figure 9:
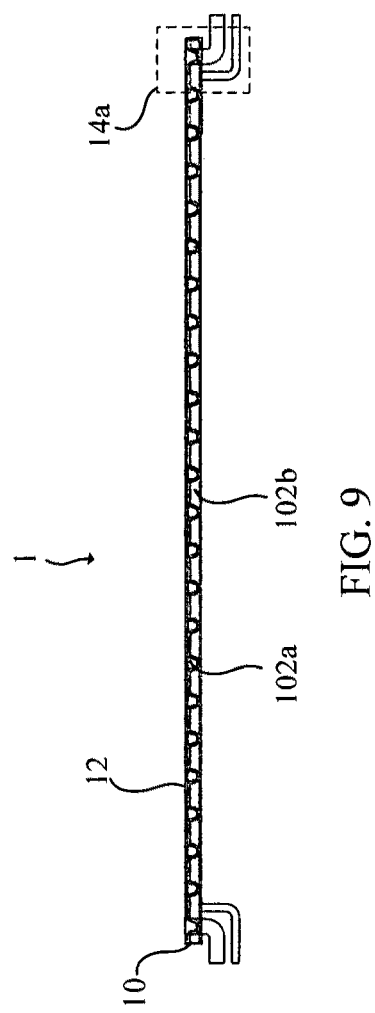
FIG. 9 illustrates a section view of a jagged multi-layer assembly, according to some embodiments.

FIG. 9 illustrates a section view of a jagged multi-layer assembly, according to some embodiments. As shown in FIG. 9, the channels of all the layers form a jagged pattern in a cross-sectional view along an extension direction of the channels. The multi-layer assembly 10 and the photovoltaic panel 12 can be detachably engaged with each other. Of course, the photovoltaic panel 12 can be the upper cover of the multi-layer assembly 10, that is, the multi-layer assembly 10 can only comprise a casing without the upper cover, and the layers within the multi-layer assembly 10 can be separated jagged separator floors. Further, the multi-layer assembly 10 and the photovoltaic panel 12 can be roll welded on the edges.

Figure 10:
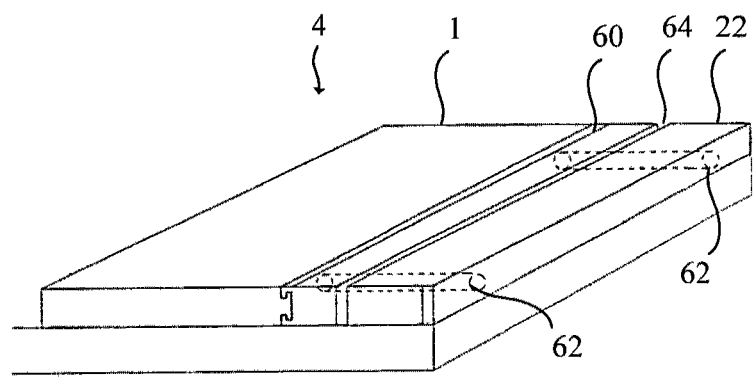
FIG. 10 illustrates a schematic diagram of an expansion feature, according to some embodiments.

FIG. 10 illustrates a schematic diagram of an expansion feature, according to some embodiments. As shown in FIG. 10, the solar energy converter 1 of the solar energy conversion system 4 can be detachably engaged with a buffer block 60, and springs 62 can be placed between the buffer block 60 and the mounting frame 22 and create an expansion gap 64, the expansion feature of the present invention can absorb the temperature changes of the material and have the ability to expand and extract.

Moreover the teachings provided herein are directed to a solar energy converter that eliminates the need to utilize assembled piping, such as copper piping, internally under the photovoltaic panel. In some embodiments, the multi-layer assembly and the manifold assembly can be manufactured in one step, respectively. As such, the solar energy conversion system can offer the art an easily manufacturable, multiple unit system. This can include, for example, mounting components on a mounting frame, in some embodiments, to accommodate a user's needs.

The terms and examples provided above are illustrative only and not intended to be limiting. The following examples are illustrative and are not to be construed as limiting to the teachings. Those skilled in the art will readily observe that numerous modifications and alterations of the teachings may be made while retaining the spirit and nature of the inventions provided herein.

EXAMPLE 1

Figure 11:
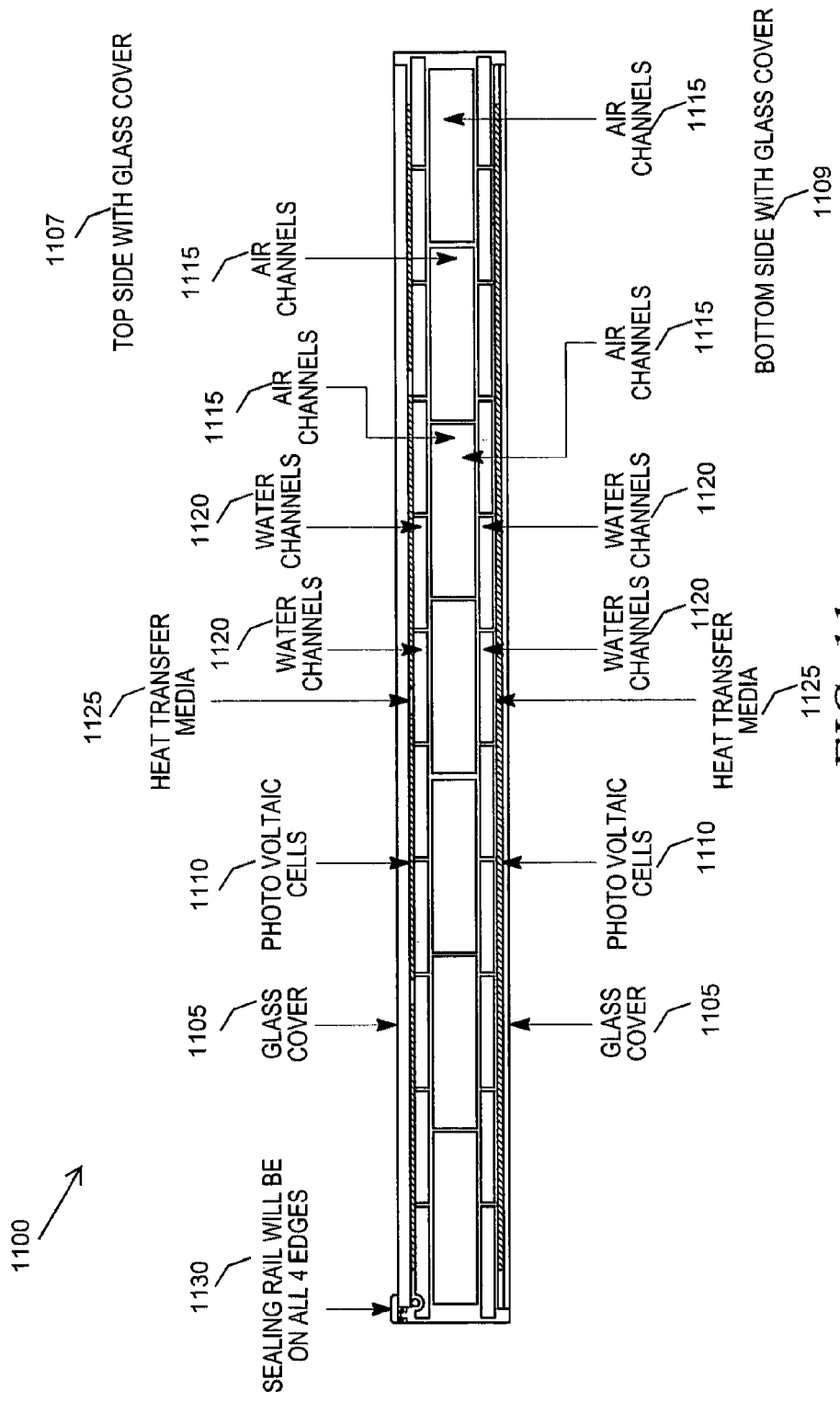
FIG. 11 illustrates a construction of a system, according to some embodiments.

This example illustrates how a system can be constructed. FIG. 11 illustrates a construction of a system, according to some embodiments. System 1100 includes protective glass cover sheets 1105 on the top side of the system 1107 and the bottom side of the system 1109 to protect the photovoltaic cells 1110, which generate the electrical power from solar energy. Air channels 1115 are designed into the system to conduct thermal energy generated in the system 1100 to a consumer in a gas phase. Water channels 1120 to conduct thermal energy generated in the system to the consumer in a liquid phase.

Heat transfer media 1125 can be included to conduct the heat from the photovoltaic cells 1110 to the gas and liquid phase. Note the gas and liquid phase are working fluids and may be any suitable liquid or gas known to one of skill that would function as desired in the transfer of heat from the system. Likewise, the heat transfer media can be any conductive media known to one of skill that would function to assist in the heat transfer.

The system can be further contained by including a sealing means, such as a sealing rail 1130 around the edges of the system.

Figure 12:
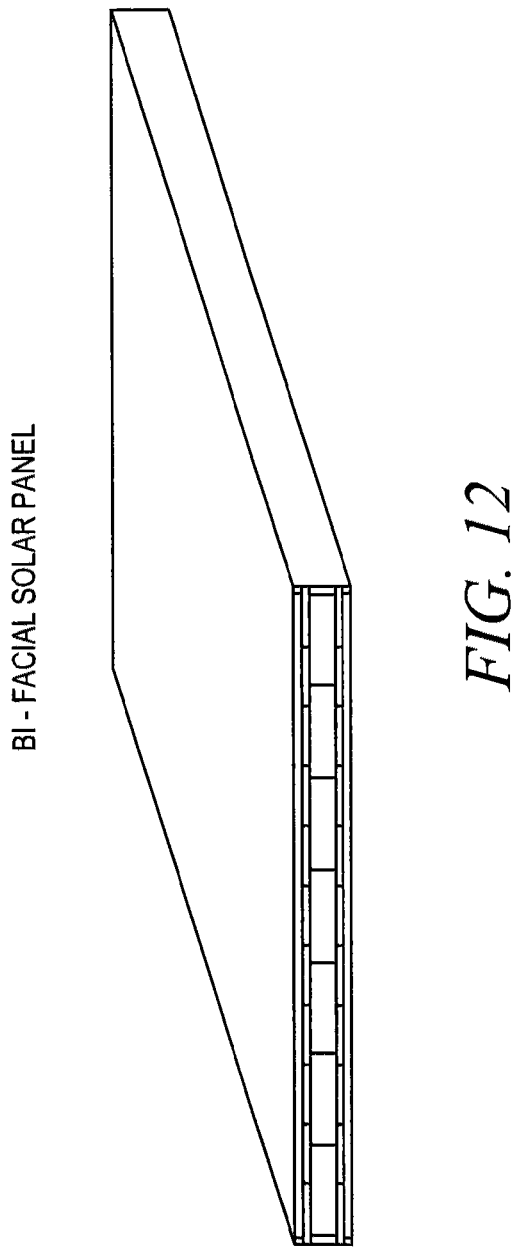
FIG. 12 illustrates an isometric view of the panel showing the planar surface of the heat exchanger, according to some embodiments.

FIG. 12 illustrates an isometric view of the panel showing the planar surface of the heat exchanger, according to some embodiments.

Figure 13:
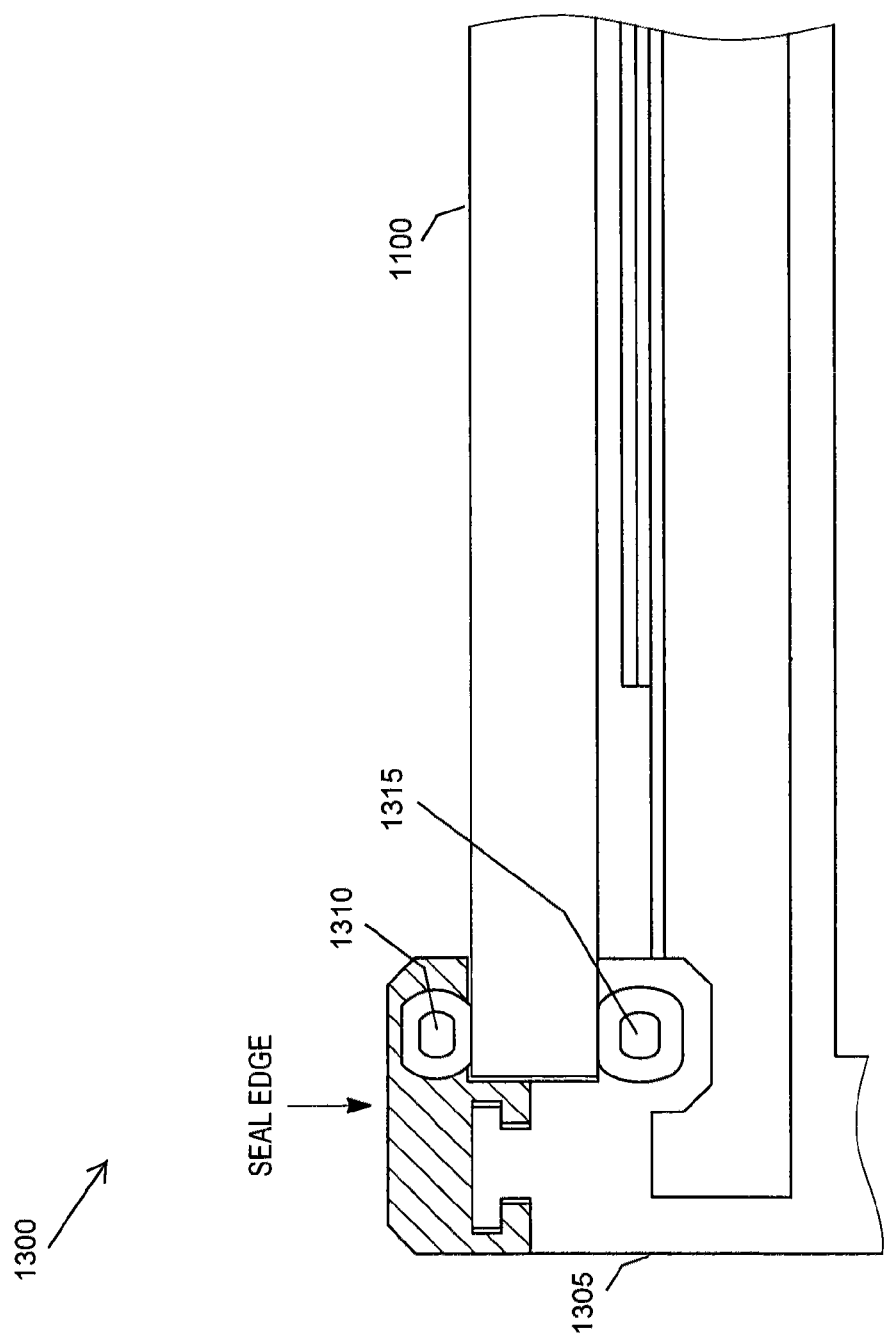
FIG. 13 illustrates a side view of the system with a manifold, according to some embodiments.

The system can be designed to include a manifold for distribution of thermal energy from the system. FIG. 13 illustrates a side view of the system with a manifold, according to some embodiments. The side view 1300 of an end manifold 1305 showing the manifold separating out the working fluid streams, such as a gas stream 1310 and a liquid stream 1315, providing for an efficient and space-conserving separation of these working streams to prevent cross contamination and leakage from one stream to another.

Figure 14:
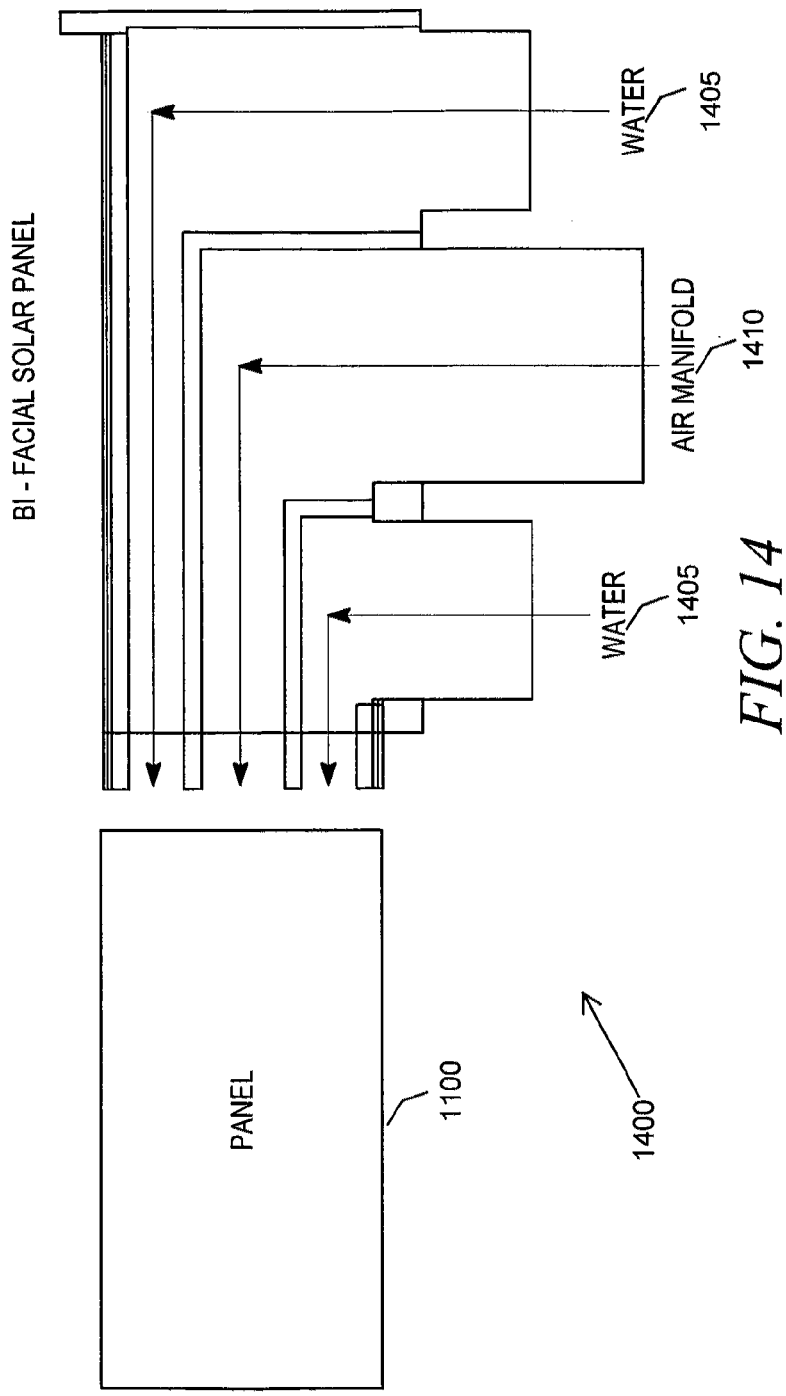
FIG. 14 illustrates a seal rail, according to some embodiments.

FIG. 14 illustrates a seal rail, according to some embodiments. Seal rail 1400, such as the seal rail shown in FIG. 11, can be used, at least in part, to help prevent external environmental contaminants from entering the device. The plurality of channels for separating and distributing water 1405 and air 1410 can be seen in the figure.

EXAMPLE 2

The systems taught herein include a single-unit, multimodal device combining both solar thermal and solar photovoltaic energy capture. The systems can be configured in modalities to enable capture of photo-voltaic generated energy from both the sun-facing side of the panel as well as reflected or scattered photovoltaic energy from photovoltaic structures mounted on the rear surface of the device. In addition, the unit captures an abundance of thermal energy that falls on the panel and is available for harvesting through multiple working fluid streams.

The thermal energy (heat) removal functions of the panel increases the energy density from the panel and serves to cool the photovoltaic cells. The photovoltaic cells are mounted on the panel and, as a result of the cooling of the system, provide a surprisingly consistent electrical power output.

Figure 15:
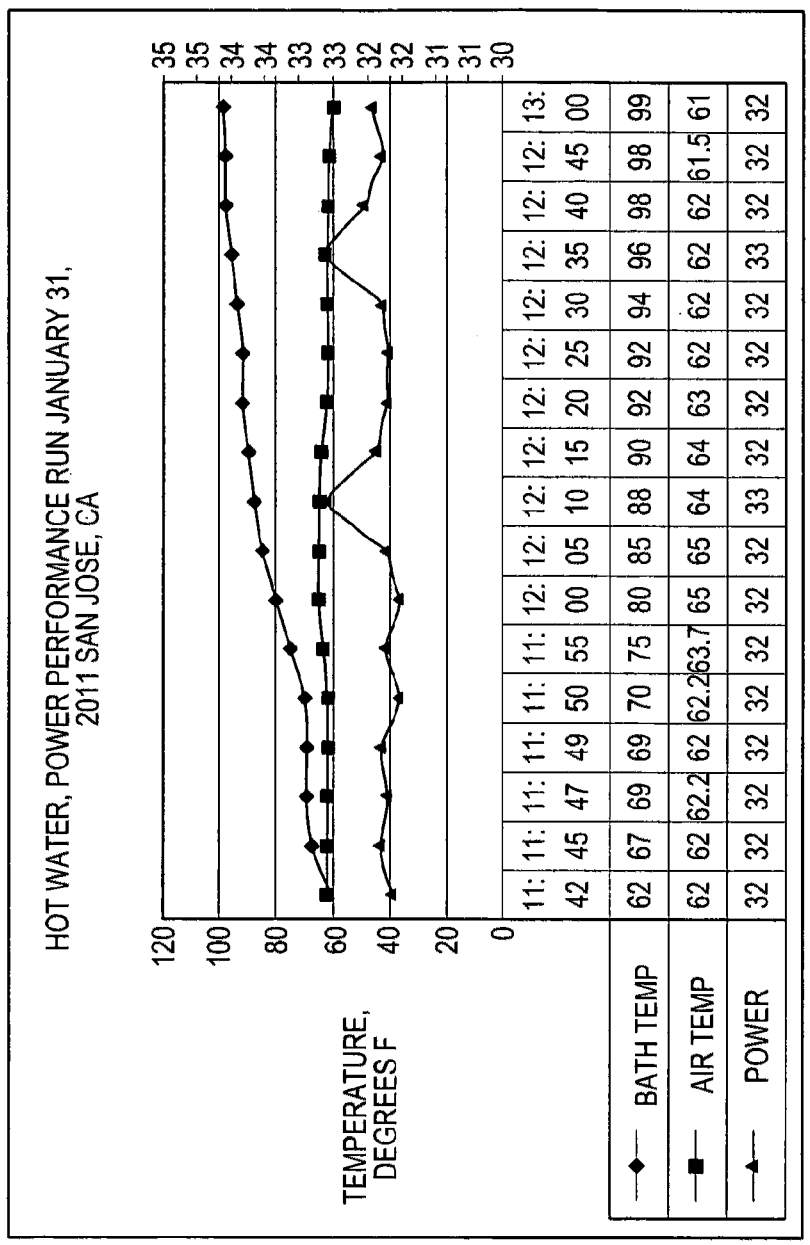
FIG. 15 illustrates a consistent power output of a system having only one photovoltaic layer with a gas and liquid cooling means as taught herein, according to some embodiments.

FIG. 15 illustrates a consistent power output of a system having only one photovoltaic layer with a gas and liquid cooling means as taught herein, according to some embodiments. As can be seen from the figure, when exposed to direct sunlight, the panel generated a constant 32 watts of electrical power and heated water at a temperature of 100 F, without loss of power due to heat degradation of the PV cells.

EXAMPLE 3

A system having (i) a photovoltaic layer on the front of the panel to capture and convert incident solar energy to electrical energy, along with (ii) an opposing photovoltaic layer on the back of the panel to capture and convert reflected and scattered solar energy was tested. It was discovered that by utilizing the rear side of the panel to capture reflected and scattered energy, the total energy from the system can approach twice the twice that of comparable products. Moreover, this energy density is further compounded through the capture of both electric and thermal energy through the multi-fluid heat transfer streams, providing the highest possible energy capture and conversion available in the industry today from such systems.

EXAMPLE 4

A system as taught herein was tested and compared to state of the art systems. The system as taught herein is referred to in the table below as a "Soleeva" Panel. As shown in the table, the following unexpected and surprising benefits were observed over the state of the art:

1. About 30% greater electric power output was observed in the single photovoltaic mode due to the effect of cooling the photovoltaic structures.

2. When utilizing the backside photovoltaic modality, adding the second panel to increase energy density, an additional amount of electrical power (equal to 25-70% of the front side power) is generated from reflected or back-scattered light.

3. About 32% less roof space is required, because of the compact multimodality design, and this is a particularly desirable feature to those of skill, particularly where "footprint" is an important factor due to limited space.

4. About 32% weight reduction over conventional systems because of the compact multimodality design, and this is also an installation, transportation, and structural consideration to those of skill.

TABLE

| Family Size = 4 | System Capacity | Panel Count | Installed Cost | Panel Wt (lbs) | Roof Load (lbs) | Required Roof Area | Array Size (3 × 5 ft Panels) | Useful Life |
|---|---|---|---|---|---|---|---|---|
| Residential Thermal | 150 gpd | 8 | $14,500 | 85.00 | 680.00 | 128 | 10' by 13' | 10 Years |
| Residential Electric | 5 kW | 24 | $35,000 | 49.00 | 1,176.00 | 500 | 20' by 25' | 10-12 Years |
| Combined | | 32 | $49,500 | | 1,856.00 | 628 | 25 × 25 | |
| Soleeva S3 Panel | 5 kW/180 gpd* | 22 | $30,100 | 65.00 | 1,430.00 | 425 | 20 × 20 | 15+ Years |
| Savings by using Soleeva Panels: | | 31% | 39% | | 23% | 32% | | |

Assumptions:
12% PV module efficiency
PV cost installed $6-8/watt
*actual hot water depends on environmental operating conditions
less Soleeva panels are required because of cooling effect
Soleeva utilizes micro-inverters as options to simplify installation and maximize power output

We claim:

1. A self-contained and highly efficient multi-fluid energy conversion and management system for converting solar energy to electric and thermal energy, the system comprising:
a core component that includes (i) a photovoltaic layer for converting solar energy into electrical energy, (ii) a gas thermal exchange layer containing a plurality of channels comprising a gas for heat transfer into gas media, (iii) a liquid thermal exchange layer containing a plurality of channels comprising a liquid for heat transfer into liquid media; wherein each of the thermal exchange layers are in operable thermal contact with at least one other layer;

wherein the gas thermal exchange layer and the liquid thermal exchange layer are formed together as a single unit, the channels of the thermal exchange layers form a jagged pattern, and the operable thermal contact between the gas thermal exchange layer and the liquid thermal exchange layer occurs through a separator floor in the single unit; and a manifold component formed as a single unit operable for distributing thermal energy from the core component compilation of layers and channels;

wherein each channel of the gas thermal exchange layer in the jagged pattern is disposed between two channels of the liquid thermal exchange layer.

2. The system of claim 1, wherein the system includes a tightly packed plurality of channels in at least one of the layers having efficiency of the plurality of channels in the layer ranging from about 78% to about 99%.

3. The system of claim 1, wherein the manifold component is detachably engaged with the core component and functions to separate the thermal energy into a plurality of streams comprising a gas stream and a liquid stream.

4. The system of claim 1, wherein the layers are configured in a stacked orientation.

5. The system of claim 1, wherein each layer in the core component is in contact with a separator floor that separates that layer from at least one other layer in the system.

6. The system of claim 1, wherein at least one of the thermal exchange layers in the core component is formed by a single mass of material.

7. The system of claim 1, wherein at least one of the thermal exchange layers in the core component is manufactured by an extrusion process.

8. The system of claim 1, wherein at least one of the thermal exchange layers in the core component is manufactured by a casting process.

9. The system of claim 1, wherein at least a portion of the core component is transparent.

10. The system of claim 1, wherein at least a portion of the core component is coated with a surface coating for enhancing protection from corrosion.

11. The system of claim 1, wherein at least a portion of the core component is coated with surface coating for enhancing absorption of the infra-red spectrum of the solar energy.

12. The system of claim 1, wherein the core component comprises channels configured in a honey-comb pattern.

13. The system of claim 1, wherein the manifold component comprises comprise a plurality of channels, each channel in the plurality of channels corresponding to a thermal exchange layer in the core component.

14. The system of claim 1, wherein the core component or the manifold component is configured to create a turbulent flow in a liquid stream for increasing heat transfer efficiency.

15. The system of claim 1, wherein the component further comprises a cleaning passage for cleaning the photovoltaic panel, the cleaning passage comprising a cleaning chamber and a cleaning valve, the cleaning valve is substantially aligned with the top surface of the photovoltaic panel, the cleaning chamber contain water for gushing out of the cleaning valve to clean the photovoltaic panel.

16. A method for generating electric energy and heated fluid, said method comprising the following steps:

providing a first photovoltaic panel comprising a plurality of photovoltaic cells for converting incident solar energy into electric energy;

providing a multi-layer assembly comprising a plurality of thermal exchange layers including a gas thermal exchange layer and a liquid thermal exchange layer, the liquid thermal exchange layer containing a plurality of channels containing a liquid for transporting heat to a gas and the gas thermal exchange layer containing a plurality of channels containing a gas for transporting heat to a liquid; and distributing the gas and the liquid from the multi-layer assembly to transport thermal energy;

wherein, each of the thermal exchange layers are in operable thermal contact with at least one other layer;

contain a channel for transport a liquid or gas;

provide a thermal contact between a wall of the channel and a wall of at least one of the other layers; and the gas thermal exchange layer and the liquid thermal exchange layer are formed together as a single unit, the channels of the thermal exchange layers form a jagged pattern, and the operable thermal contact between the gas thermal exchange layer and the liquid thermal exchange layer occurs through a separator floor in the single unit using a manifold component formed as a single unit operable for distributing thermal energy from the core component compilation of layers and channels;

wherein each channel of the gas thermal exchange layer in the jagged pattern is disposed between two channels of the liquid thermal exchange layer.

17. The method of claim 16, further providing a second photovoltaic panel opposing the first photovoltaic panel and comprising a plurality of photovoltaic cells for converting scatter solar energy into electrical energy.

18. A solar energy conversion system comprising:

A casing containing (i) a first photovoltaic layer for converting incident solar energy into electrical energy, (ii) a gas thermal exchange layer containing a plurality of channels comprising a gas for heat transfer into gas media, (iii) a liquid thermal exchange layer containing a plurality of channels comprising a liquid for heat transfer into liquid media; wherein each of the thermal exchange layers are in operable thermal contact with at least one other layer;

wherein the gas thermal exchange layer and the liquid thermal exchange layer are formed together as a single unit, the channels of the thermal exchange layers form a jagged pattern, and the operable thermal contact between the gas thermal exchange layer and the liquid thermal exchange layer occurs through a separator floor in the single unit; and a manifold component having a plurality of channels in operable communication with at least the gas thermal exchange layer and the liquid thermal exchange layer for distributing thermal energy, wherein each channel of the gas thermal exchange layer in the jagged pattern is disposed between two channels of the liquid thermal exchange layer.

19. The system of claim 18, wherein at least one of the thermal exchange layers in the core component is manufactured as a single unit by an extrusion or cast process.

20. The system of claim 18, wherein the system includes a tightly packed plurality of channels in at least one of the later having a packing efficiency of the plurality of channels in the layer ranging from about 78% to about 99%.

* * * * *